(12) United States Patent
Martin et al.

(10) Patent No.: US 7,171,010 B2
(45) Date of Patent: Jan. 30, 2007

(54) DYNAMIC BASS BOOST APPARATUS AND METHOD

(75) Inventors: Stephen L. Martin, Acton, MA (US); Gregory B. Burlingame, Woburn, MA (US); John R. David, Cambridge, MA (US); Glenn G. Rogge, Pepperell, MA (US)

(73) Assignee: Boston Acoustics, Inc., Peabody, MA (US)

( * ) Notice: Subject to any disclaimer, the term of this patent is extended or adjusted under 35 U.S.C. 154(b) by 123 days.

(21) Appl. No.: 10/660,447

(22) Filed: Sep. 11, 2003

(65) Prior Publication Data

US 2005/0058303 A1 Mar. 17, 2005

(51) Int. Cl.
*H03G 5/00* (2006.01)
*H03G 9/00* (2006.01)

(52) U.S. Cl. ........................................ 381/98; 381/102
(58) Field of Classification Search .................. 381/98, 381/101, 102, 106, 317, 318, 100, 103, 96, 381/83, 93; 333/14
See application file for complete search history.

(56) References Cited

U.S. PATENT DOCUMENTS

| | | | |
|---|---|---|---|
| 3,789,313 A * | 1/1974 | Sanderson | 330/107 |
| 4,327,250 A | 4/1982 | von Recklinghausen | |
| 4,429,181 A | 1/1984 | Freadman | |
| 4,696,044 A * | 9/1987 | Waller, Jr. | 381/106 |
| 4,739,514 A | 4/1988 | Short et al. | |
| 4,750,207 A * | 6/1988 | Gebert et al. | 381/317 |
| 4,940,977 A * | 7/1990 | Mandell | 341/143 |
| 5,170,434 A * | 12/1992 | Anderson | 381/317 |
| 5,172,358 A * | 12/1992 | Kimura | 369/47.26 |
| 5,200,716 A * | 4/1993 | Amano | 333/17.1 |
| 5,285,502 A * | 2/1994 | Walton et al. | 381/94.2 |
| 5,331,299 A * | 7/1994 | Smith | 333/175 |
| 5,337,368 A * | 8/1994 | Kikuchi et al. | 381/103 |
| 5,371,803 A * | 12/1994 | Williamson, III | 381/104 |
| 5,550,925 A * | 8/1996 | Hori et al. | 381/98 |
| 5,574,398 A * | 11/1996 | Hagino et al. | 327/557 |
| 5,907,623 A * | 5/1999 | Mercs et al. | 381/94.1 |
| 5,910,904 A * | 6/1999 | Uramoto | 708/300 |
| 5,974,156 A * | 10/1999 | Sauvagerd | 381/98 |
| RE37,223 E | 6/2001 | Bose et al. | |

* cited by examiner

*Primary Examiner*—Xu Mei
(74) *Attorney, Agent, or Firm*—Sheehan, Phinney, Bass & Green, P.A.; Peter A. Nieves

(57) ABSTRACT

Audio processing methods and apparatus are provided for at least partially compensating for the Fletcher-Munson effect. An audio processor includes a variable filter receiving an input signal and providing a filtered output signal, the variable filter having a fixed cutoff frequency and a quality factor that is controllable in response to a control signal, and a control circuit configured to detect a signal level representative of input signal level in a selected band and to generate the control signal in response to the detected signal level. The control circuit may include a low-pass band select filter and a detector for detecting a signal level in the band selected by the low-pass filter and for generating the control signal.

54 Claims, 6 Drawing Sheets

DYNAMIC BASS BOOST APPARATUS AND METHOD

FIELD OF THE INVENTION

This invention relates to systems and methods for processing audio signals and, more particularly, to systems and methods for dynamically controlling the bass frequency band of audio signals as a function of volume level.

BACKGROUND OF THE INVENTION

The Fletcher-Munson effect is the name given to the well-known fact that human perception of sound in the bass frequency band (frequencies less than about 500 Hz) is influenced by the volume level of the sound. In particular, the sensitivity of a human listener to bass frequencies decreases as volume level decreases, while the sensitivity to higher frequencies decreases to a lesser degree. Accordingly, music played at low volume levels is perceived as lacking bass frequencies. The Fletcher-Munson effect can be compensated for by increasing the sound energy at low frequencies relative to the sound energy at higher frequencies.

To achieve such compensation, audio filter circuits have been designed to increase the bass frequency band of an electrical audio signal (referred to herein as an audio signal) used to produce an audio output, relative to higher frequencies, as volume level decreases. Such systems are sometimes referred to as bass boost circuits.

Compensation may be provided using a manual, two-level compensation scheme, such as a conventional loudness feature on a stereo, or compensation may be dynamic. Dynamic filter circuits produce sounds with bass frequencies that are automatically controlled relative to the higher frequencies as a function of the volume of the sound produced. Such conventional audio circuits may quantify volume level based on sound pressure or based on the amplitude of an audio signal, and may increase low frequency components of the sound output.

All known dynamic bass boost circuits have had one or more drawbacks, including but not limited to excessive complexity, excessive cost and an inability to produce a high quality sound output. Accordingly, there is a need for improved dynamic bass boost apparatus and methods.

SUMMARY OF THE INVENTION

According to a first aspect of the invention, an audio processor is provided. The audio processor comprises a variable filter receiving an input signal and providing a filtered output signal, the variable filter having a fixed cutoff frequency and a quality factor that is controllable in response to a control signal, and a control circuit configured to detect a signal level representative of input signal level in a selected band and to generate the control signal in response to the detected signal level.

In one embodiment, the variable filter comprises a highpass, state variable filter. The control circuit may comprise a low-pass filter configured for passing the selected band and a detector configured for detecting the signal level in the selected band and for establishing time constants of the control signal. The control circuit may be configured to establish an inverse relationship between the quality factor of the variable filter and the detected signal level. More particularly, the control circuit may be configured to control bass audio frequencies to limit the Fletcher-Munson effect.

In some embodiments, the variable filter includes a voltage-controlled resistor circuit for controlling the quality factor in response to the control signal. In other embodiments, the variable filter includes a series gain/attenuation element for controlling the quality factor in response to the control signal.

In another embodiment, the variable filter comprises a fixed band-pass filter in series with a variable gain element responsive to the control signal to provide a controlled band-pass signal, and a summer for combining the controlled band-pass signal and the input signal to provide the output signal.

In some embodiments, the control circuit may include a non-linear amplifier to establish a desired relationship between the quality factor of the variable filter and the detected signal.

In a further embodiment, the variable filter comprises a digital filter receiving an input data stream and providing a filtered output data stream, and the control signal comprises a control variable. In this embodiment, the control circuit may comprise a digital low-pass filter for passing the selected band and a detector algorithm configured for detecting the signal level in the selected band and for generating the control variable in response to the detected signal level. The detector algorithm may comprise an RMS detector algorithm.

According to a second aspect of the invention, an audio processor comprises a variable filter receiving an input signal and providing a filtered output signal, the variable filter having a fixed cutoff frequency and a quality factor that is controllable in response to a control signal, a low-pass filter for selecting a band of the output signal, and a detector for detecting a signal level in the band selected by the low-pass filter and for generating the control signal in response to the detected signal level.

According to a third aspect of the invention, an audio processing method comprises filtering an input signal in a filter and providing a filtered output signal, detecting a signal level representative of input signal level in a selected band to provide a detected signal level, and controlling a quality factor of the filter in response to the detected signal level.

According to a fourth aspect of the invention, an audio processor is provided. The audio processor comprises a digital state variable, high-pass filter receiving an input data stream and providing a filtered output data stream, the digital filter having a fixed cutoff frequency and a quality factor that is controllable in response to a control variable, a digital band select filter for selecting a band of the output data stream, and a detector algorithm for detecting a signal level in the band selected by the digital band select filter and for generating the control variable in response to the detected signal level.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
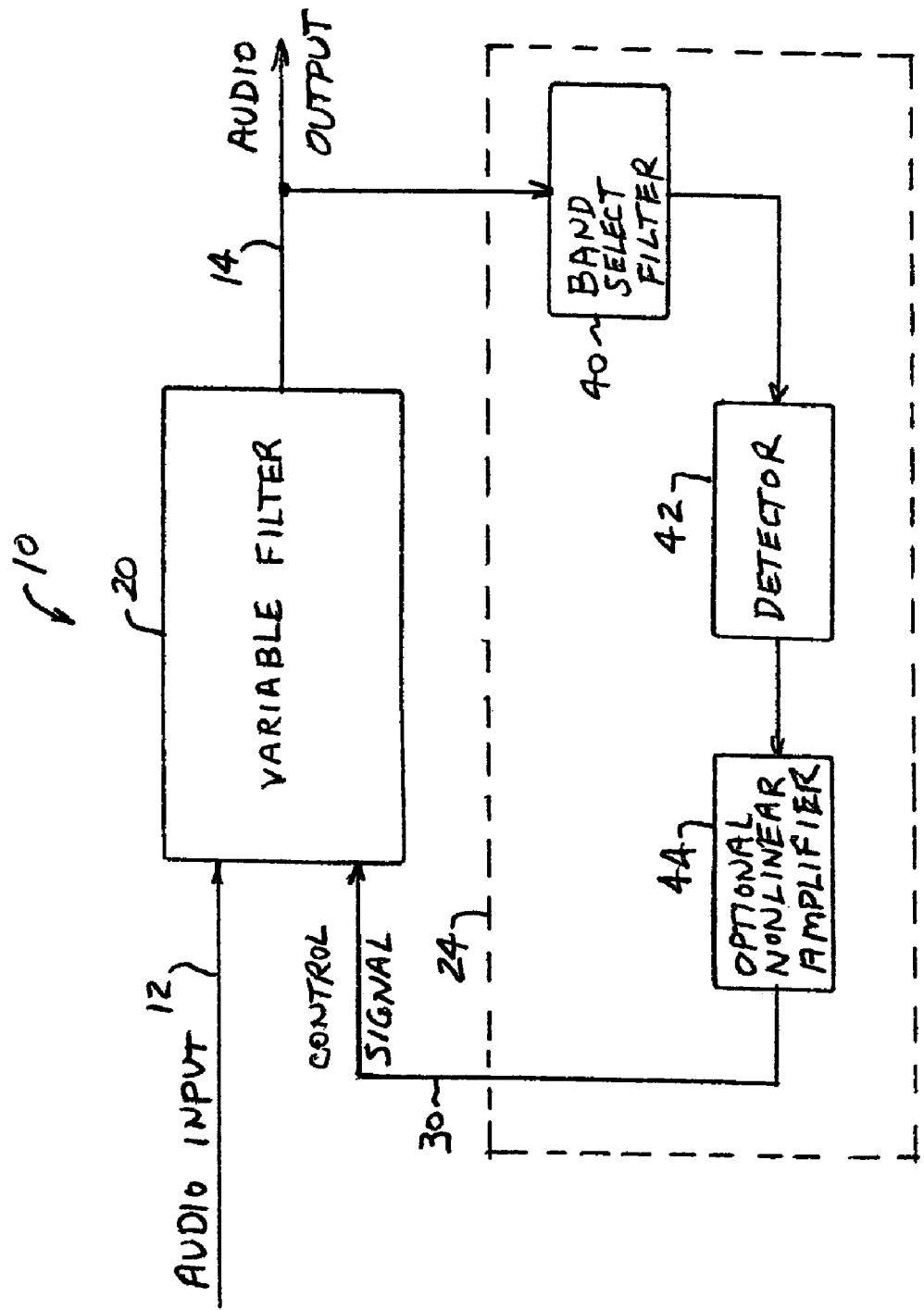
FIG. 1 is a block diagram of an audio processor in accordance with a first embodiment of the invention.

An audio processor, or dynamic bass boost circuit, in accordance with a first embodiment of the invention is shown in FIG. 1. A dynamic bass boost circuit 10 receives an audio input signal 12 and provides a filtered audio output signal 14 having controlled bass frequencies so as to at least partially compensate for the Fletcher-Munson effect. Partial compensation for the Fletcher-Munson effect may include enhancement of only selected bass frequencies and/or less than full compensation for the Fletcher-Munson effect at one or more frequencies.

Dynamic bass boost circuit 10 includes a variable filter 20 and a control circuit 24. Control circuit 24 receives audio output signal 14 and provides a control signal 30 to variable filter 20. The control signal 30 controls the frequency characteristic of variable filter 20 as a function of volume level to at least partially compensate for the Fletcher-Munson effect.

Audio input signal 12 may be any suitable audio signal. For example, input signal 12 may be received from a stereo receiver or a compact disc (CD) unit. Input signal 12 may be amplified by a pre-amplifier (not shown) prior to dynamic bass boost circuit 10.

Audio output signal 14 may be used to drive a sound transducer such as an audio speaker through a power amplifier. However, additional components, such as filters or a dynamics processor, may process audio output signal 14 before it is supplied to an amplifier and speaker.

Variable filter 20 may be any suitable filter having a gain in a selected band, such as the bass frequency band, that may be varied as a function of a control signal. As described below, the gain in the selected bass frequency band is varied as a function of the magnitude of the low frequency component of audio output signal 14, so that the frequency response of the variable filter is substantially the inverse of the sensitivity of human hearing, thereby compensating for the Fletcher-Munson effect, at least partially. Variable filter 20 has a fixed cutoff frequency and a quality factor (commonly referred to as Q) that is controllable in response to control signal 30. In one embodiment, variable filter 20 is a high-pass filter.

Control circuit 24 may include a band select filter 40 and a detector 42, and may include an optional non-linear amplifier 44. Band select filter 40 may be any suitable filter capable of selecting a low frequency portion of audio output signal 14 that is used to control variable filter 20. The low frequency band is selected to provide an output indicative of the Fletcher-Munson effect. In some embodiments, band select filter 40 attenuates frequencies above about 2.2 kHz. Band select filter 40 may be an active filter or a passive filter. Suitable filters include a low-pass filter, a band-pass filter and a low-pass shelf filter.

Detector 42 rectifies and smoothes the output of band select filter 40. Detector 42 thus includes a rectifier and a filter having a known time constant. The rectifier may be a half-wave rectifier or a full-wave rectifier and may have adjustable gain. The rectifier can be an active or a passive device. The filter is capable of smoothing the output of the rectifier. The time constant of the filter is selected to attenuate high frequency components of control signal 30 that may cause the Q of variable filter 20 to vary rapidly, thereby causing harmonic distortion. For example, the filter can be an integrator or a passive low-pass filter. The time constant may have a fast attack time to provide quick response and a relatively slow decay time to provide adequate smoothing. The attack time constant may be in a range from approaching zero to about 5 milliseconds (about 5 milliseconds or less), and the decay time constant may be in a range of about 0.5 to 2.0 seconds.

In some embodiments, the optional non-linear amplifier 44 may be utilized in control circuit 24. Non-linear amplifier 44 has a non-linear gain as a function of input amplitude and thus provides a non-linear control signal. Accordingly, non-linear amplifier 44 may establish a desired relationship between the output of detector 42 and control signal 30. Non-linear amplifier 44 may be located in any suitable location in control circuit 24.

Figure 2:
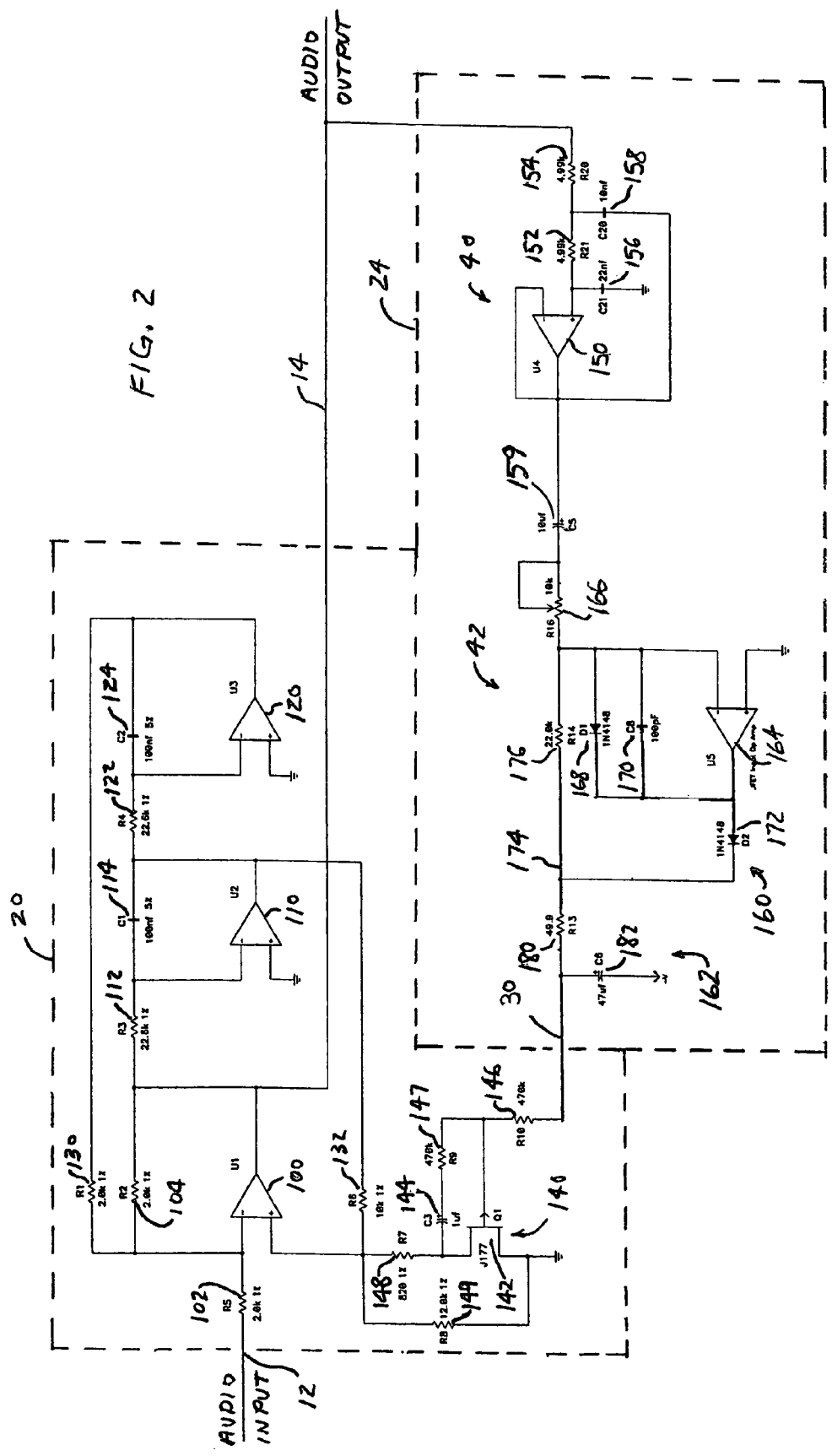
FIG. 2 is a schematic diagram of an audio processor in accordance with a second embodiment of the invention.

An audio processor in accordance with a second embodiment of the invention is shown in FIG. 2. Like elements in FIGS. 1 and 2 have the same reference numerals. The embodiment of FIG. 2 is a specific implementation of the audio processor of FIG. 1, with non-linear amplifier 44 omitted.

In the embodiment of FIG. 2, variable filter 20 is a high-pass, state variable filter. The high-pass, state variable filter 20 includes operational amplifiers 100, 110, and 120 coupled in series. Operational amplifier 100 has an input resistor 102 and a feedback resistor 104, which form a summer. Operational amplifier 110 has an input resistor 112 and a feedback capacitor 114, which form a first integrator. Operational amplifier 120 has an input resistor 122 and a feedback capacitor 124, which form a second integrator. A feedback resistor 130 is connected between the output of amplifier 120 and the inverting input of amplifier 100. A feedback resistor 132 is coupled between the output of amplifier 110 and the non-inverting input of amplifier 100.

A voltage-controlled resistor circuit 140, including transistor 142, capacitor 144 and resistors 146, 147, 148 and 149, is controlled by control signal 30 and serves as a shunt attenuation element. Voltage-controlled resistor circuit 140 and resistor 132 form a variable voltage divider which controls the amount of feedback from amplifier 110 to the inverting input of amplifier 100 in response to control signal 30. This mechanism allows control signal 30 to control the quality factor (Q) of variable filter 20. The high-pass output of variable filter 20 is taken from the output of operational amplifier 100.

In the embodiment of FIG. 2, band select filter 40 is an active second-order low-pass filter, including an operational amplifier 150, resistors 152 and 154, and capacitors 156 and 158. In the embodiment of FIG. 2, low-pass filter 40 has a cutoff frequency of about 2.2 kHz.

Detector 42 includes a rectifier 160 and a smoothing filter 162. In this embodiment, detector 42 is implemented as a peak detector. Band select filter 40 is coupled to detector 42 by a DC blocking capacitor 159. Rectifier 160 includes an operational amplifier 164 having a variable input resistor 166 and a feedback resistor 176. The ratio of resistor 176 to resistor 166 sets the gain of the rectifier. A diode 168 and a capacitor 170 are connected in parallel between the output of operational amplifier 164 and its inverting input. A diode 172 is connected between the output of amplifier 164 and a rectifier output 174. Feedback resistor 176 is connected between rectifier output 174 and the inverting input of amplifier 164. Smoothing filter 162 includes a resistor 180 and a capacitor 182. Rectifier 160 functions as a variable gain active half-wave rectifier. Detector 42 is configured to control the time constants of control signal 30.

In the embodiment of FIG. 2, control signal 30 has an attack time constant of about 2 milliseconds and a decay time constant of about one second. The attack time constant is set by resistor 180 and capacitor 182. The decay time constant is set by resistor 176 and capacitor 182. It should be noted that if resistor 176 is changed to adjust the decay time constant, the rectifier gain is also changed. The change in resistor 176 should be compensated by a proportional change in resistor 166 to maintain the original gain. Rapid variations in the characteristics of variable filter 20 are prevented by the relatively slow decay time of smoothing filter 162.

Suitable component values for the audio processor of FIG. 2 are now given. It will be understood that these values are given by way of example only and are not limiting as to the scope of the present invention.

Operational amplifiers 100, 110, 120—MC33079 (On Semiconductor, Inc.)
Operational amplifiers 150, 164—TL082 (National Semiconductor)
Resistors 102, 130, 104—2.0 K ohms
Resistors 112, 122—22.6 K ohms
Capacitors 114, 124—100 nanofarads
Resistor 132—10 K ohms
Resistor 149—12.0 K ohms
Resistor 148—820 ohms
Resistors 146, 147—470 K ohms
Transistor 142—J177 p-channel FET
Capacitor 144—1 microfarad
Resistors 152, 154—4.99 K ohms
Capacitor 156—22 nanofarads
Capacitor 158—10 nanofarads
Capacitor 159—10 microfarads
Variable resistor 166—10 K ohms
Resistor 176—22.0 K ohms
Diodes 168, 172—1N4148
Capacitor 170—100 picofarads
Resistor 180—49.9 ohms
Capacitor 182—47 microfarads It will be understood that other component values and other circuits may be utilized within the scope of the invention.

In operation, the audio output signal 14 is filtered by low-pass band select filter 40 to provide a filtered signal, and the filtered signal is rectified and smoothed by detector 42. Thus, the magnitude of control signal 30 is a function of the amplitude of the audio output signal 14 within the band selected by filter 40 and the gain of detector 42 as set by resistor 166. The voltage-controlled resistor circuit 140 establishes an inverse relationship between control signal 30 and the quality factor of variable filter 20. In particular, as the detected signal level decreases, control signal 30 decreases and voltage-controlled resistor circuit 140 is configured to increase the quality factor of variable filter 20 and to thereby increase the amplitude of bass frequencies relative to higher frequencies in the audio spectrum.

Figure 3:
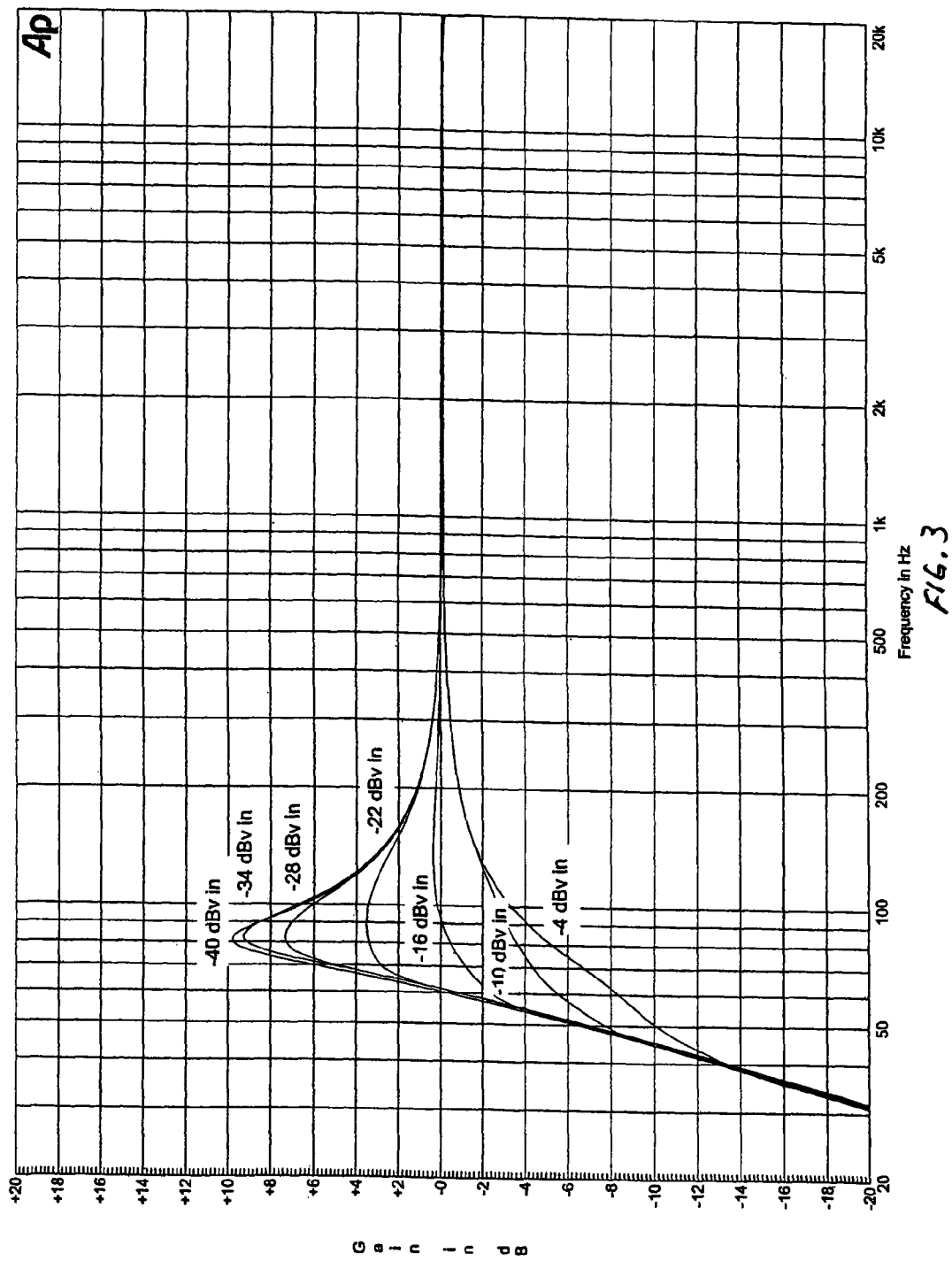
FIG. 3 is a graph of gain in dB as a function of frequency for different input signal levels of the audio processor of FIG. 2.

The performance of the audio processor of FIG. 2 is illustrated in FIG. 3, where the gain of the audio processor is plotted as a function of frequency for different input signal levels. At a relatively low input signal level of −40 dBv input, variable filter 20 has a high Q and thus higher gain in the bass frequency range of about 50 Hz to 150 Hz. As the input signal level increases, the Q of variable filter 20 is decreased, thereby decreasing the gain of the filter in the bass frequency range. Thus, for example, at an input signal level of −10 dBv, the Q of variable filter 20 is substantially decreased. It may be observed that the cutoff frequency of variable filter 20 remains substantially constant as a function of input signal level. In addition, the gain at higher frequencies, above the bass frequency range, remains substantially constant as a function of input signal level. A result is that signals in the bass frequency range are controlled relative to higher frequency audio signals. In effect the bass frequency range is "boosted" at low volume levels.

Figure 4:
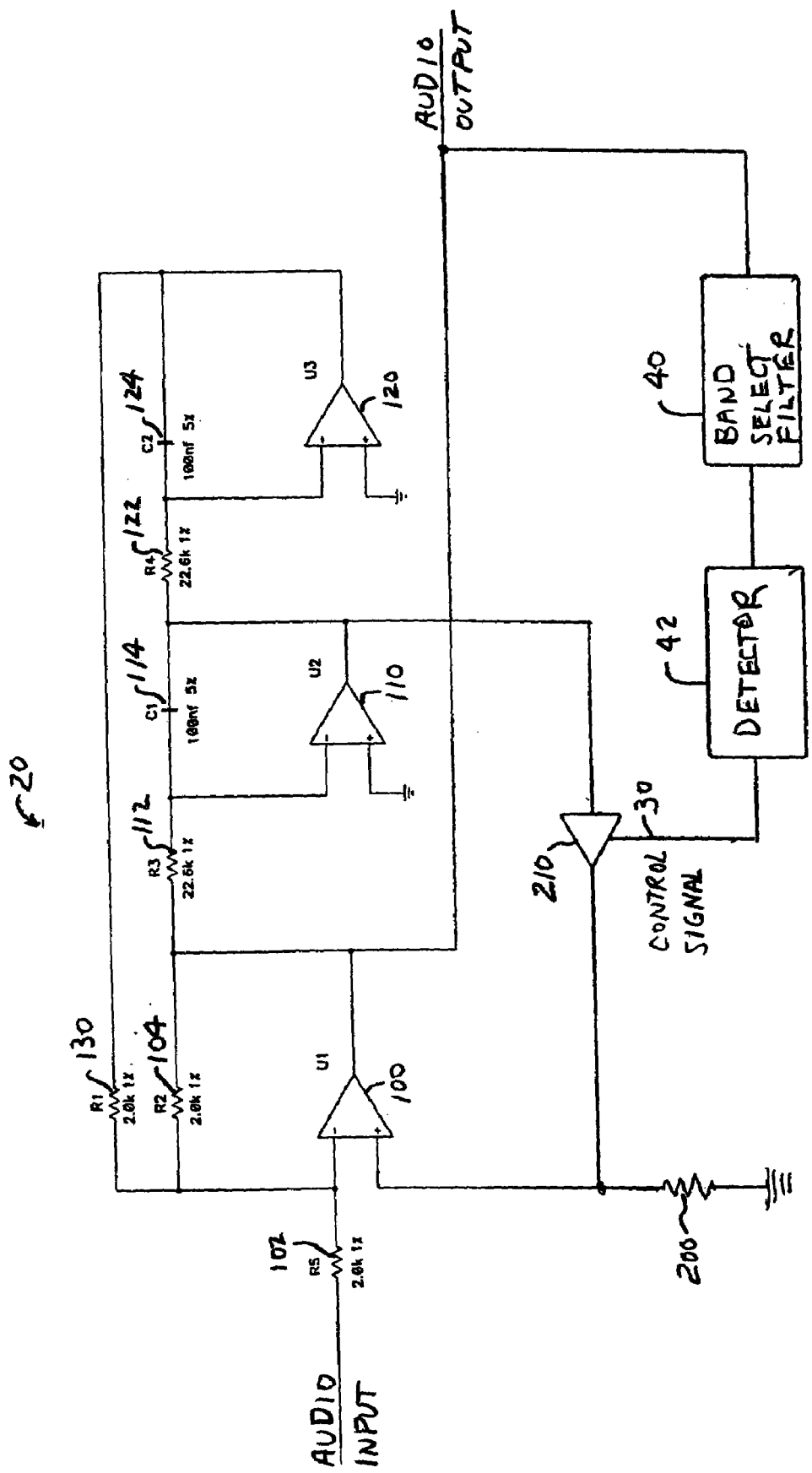
FIG. 4 is a block diagram of an audio processor in accordance with a third embodiment of the invention.

A schematic block diagram of an audio processor in accordance with a third embodiment of the invention as shown in FIG. 4. Like elements in FIGS. 1, 2 and 4 have the same reference numerals. The embodiment of FIG. 4 is another implementation of the audio processor of FIG. 1, with non-linear amplifier 44 omitted. In the embodiment of FIG. 4, voltage-controlled resistor circuit 140 (FIG. 2) is replaced with a resistor 200 connected between the non-inverting input of amplifier 100 and ground, and resistor 132 (FIG. 2) is replaced with a series gain/attenuation element 210 having a signal input connected to the output of amplifier 110 and a signal output connected to the non-inverting input of amplifier 100. The overall operation of the embodiment of FIG. 4 may be the same as the embodiment of FIG. 2, except as to series gain/attenuation element 210 and resistor 200 for controlling the quality factor of variable amplifier 20.

Control signal 30 is supplied from detector 42 to a control input of series gain/attenuation element 210. As control signal 30 varies, the amount of feedback supplied from the output of amplifier 110 to the non-inverting input of amplifier 100 is varied by series gain/attenuation element 210. Series gain/attenuation element 210 may be any suitable control circuit, such as a voltage controlled amplifier (VCA), an operational transconductance amplifier (OTA), or any other suitable control circuit. Such circuits may exhibit gain or attenuation.

Figure 5:
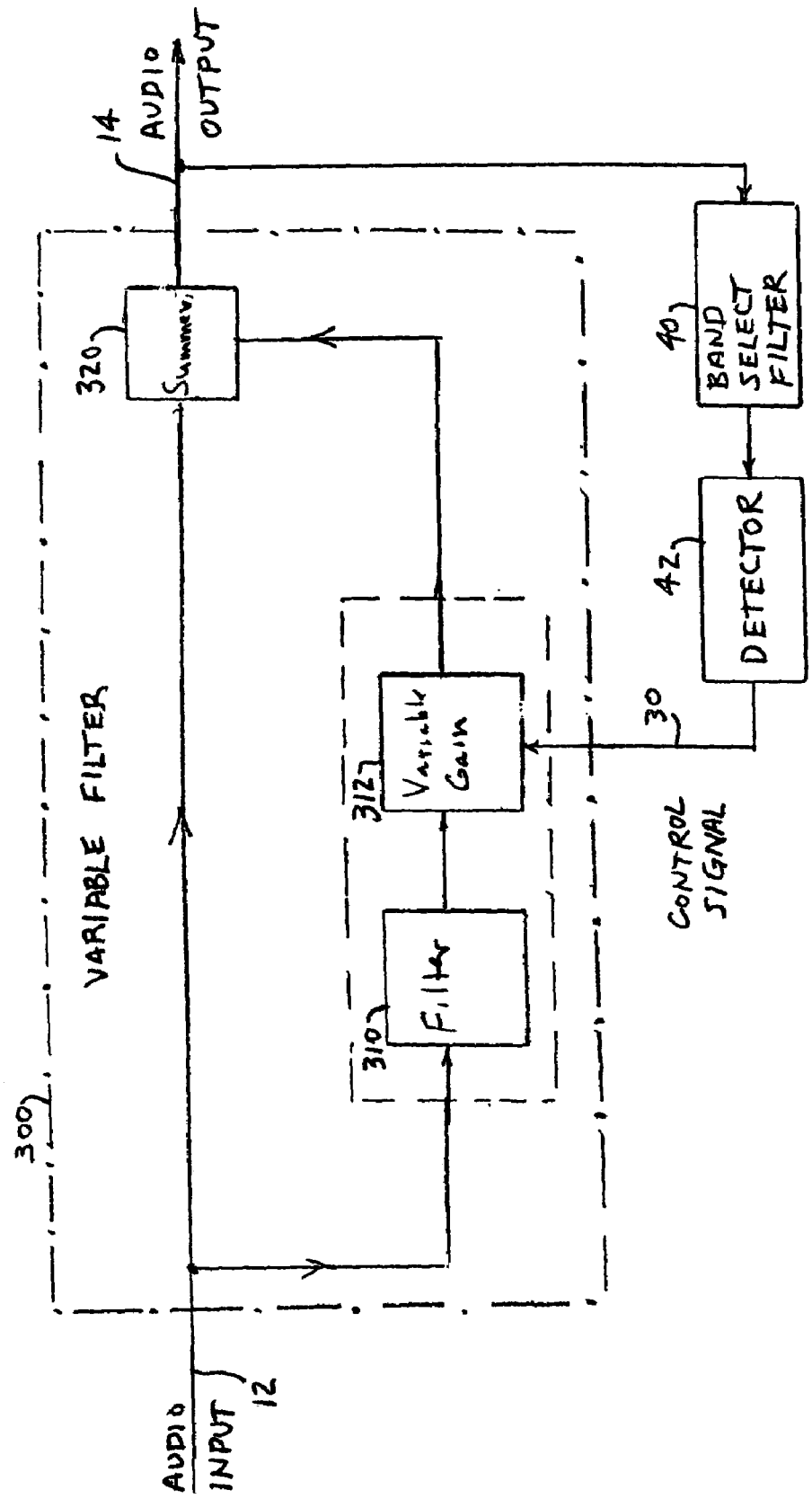
FIG. 5 is a block diagram of an audio processor in accordance with a fourth embodiment of the invention.

A schematic block diagram of an audio processor in accordance with a fourth embodiment of the invention is shown in FIG. 5. A variable filter 300 includes a fixed band-pass filter 310 connected in series with a variable gain element 312. Filter 310 may have a pass band in the bass frequency range. By way of example only, filter 310 may have a pass band from 70 Hz to 90 Hz. Variable gain element 312 has variable gain in response to control signal 30 and may, for example, be a variable gain amplifier. The series combination of filter 310 and variable gain element 312 thus produces a controlled band-pass signal having variable gain. The variable filter 300 further includes a summer 320. Summer 320 receives audio input signal 12 at a first input and receives the controlled band-pass signal from variable gain element 312 at a second input. The output of summer 320 is audio output signal 14.

In operation, filter 310 and variable gain element 312 select and amplify the bass frequency band of the audio spectrum. The output of variable gain element 312 thus has a band-pass characteristic with variable gain. The output of variable gain element 312 is summed with the audio input signal 12 to provide audio output signal 14 having a "bump" of variable amplitude in the bass frequency range. More particularly, audio output signal 14 in the embodiment of FIG. 5 has the frequency characteristic of audio input signal 12 with the controlled band-pass signal, or bump, added to input signal 12. The magnitude of the bump is controlled by band select filter 40 and detector 42 to compensate for the Fletcher-Munson effect. It may be observed that the overall characteristic of variable filter 300 has a fixed cutoff frequency and a quality factor that is variable in response to control signal 30.

Figure 6:
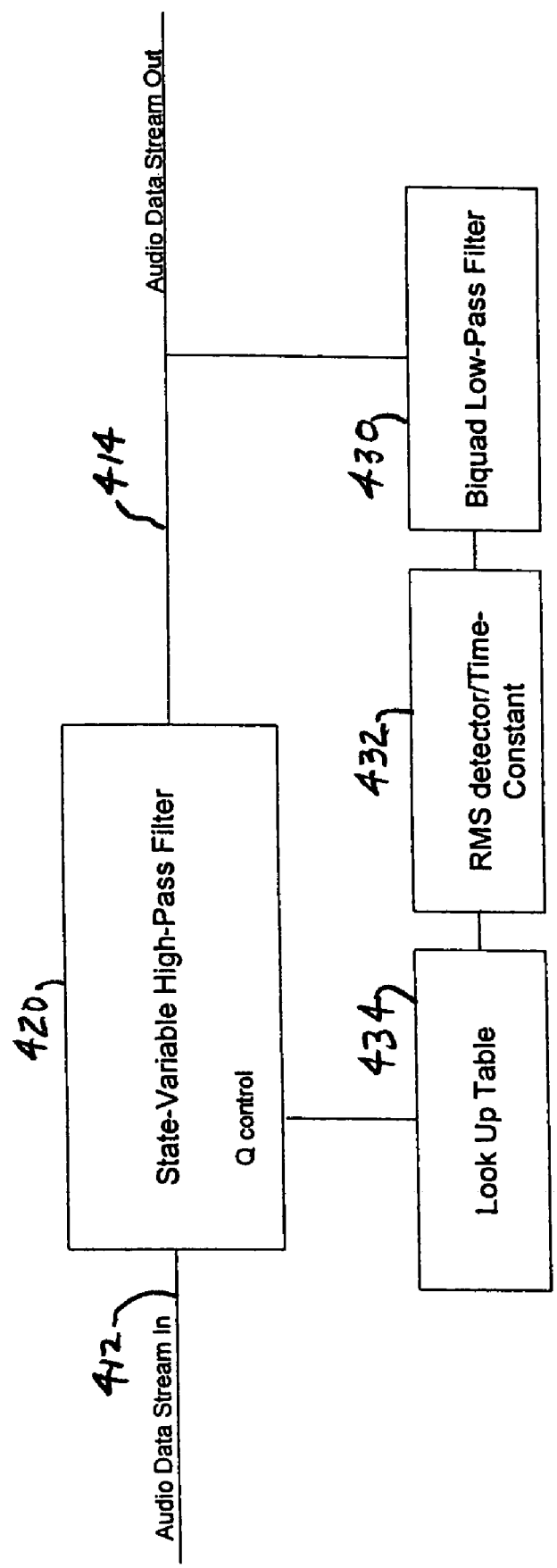
FIG. 6 is a schematic block diagram of an audio processor in accordance with a fifth embodiment of the invention.

A schematic block diagram of an audio processor in accordance with a fifth embodiment of the invention is shown in FIG. 6. The embodiment of FIG. 6 is a digital implementation. The embodiment of FIG. 6 receives an input audio data stream 412 and supplies a filtered output audio data stream 414. The digital audio processor of FIG. 6 may be implemented in a programmed digital signal processor, for example.

A digital state variable, high-pass filter 420 receives input data stream 412 and produces filtered output data stream 414. Digital filter 420 has a fixed cutoff frequency and a quality factor that is controllable in response to a control signal in the form of a control variable. The quality factor is controlled such that for large signals the filter has a low quality factor and for small signals the filter has a high quality factor. The digital filter 420 thereby compensates for the Fletcher-Munson effect.

The output data stream 414 is supplied to a digital biquad low-pass filter 430 for selecting a band of the output signal. The data from low-pass filter 430 is supplied to an RMS detector algorithm 432 for detecting signal level and generating the control variable in response to the detected signal level. The time constants for the RMS detector 432 may include an attack time constant in a range from approaching zero to about 5 milliseconds and a decay time constant in a range of about 0.5 to 2.0 seconds. A lookup table 434 establishes an inverse relation between the quality factor of the high-pass filter 420 and the detected signal level. A Q control output of lookup table 434 is applied to a multiplier within the digital filter 420, which determines the gain of the positive feedback from the digital filter band-pass output to the input of the digital filter. Lookup table 434 permits bass boost control over a range of −40 dBv to 0 dBv. The bass boost is the same for RMS values below −40 dBv, but is included in the lookup table. The lookup table 434 has 1/Q values for RMS values in 3 dB increments from −96 dBv to 0 dBv.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An audio processor comprising:
a variable filter receiving an input signal and providing an output signal, said variable filter having a quality factor that is controlled in response to a control signal, while a cutoff frequency of the variable filter remains fixed; and
a control circuit configured to detect a signal level in the output signal representative of an input signal level in a selected band and to generate the control signal in response to the detected signal level, wherein a magnitude of the control signal is a function of an amplitude of the output signal within the selected band.

2. An audio processor as defined in claim 1, wherein said variable filter comprises a high-pass state variable filter.

3. An audio processor as defined in claim 1, wherein said control circuit comprises a low-pass filter configured for passing the selected band.

4. An audio processor as defined in claim 3, wherein said control circuit further comprises a detector configured for detecting the signal level in the selected band and for establishing time constants of the control signal.

5. An audio processor as defined in claim 4, wherein the control signal has an attack time constant of about 5 milliseconds or less and a decay time constant in a range of about 0.5 to 2.0 seconds.

6. An audio processor as defined in claim 1, wherein said control circuit is configured to establish an inverse relationship between the quality factor of the variable filter and the detected signal level.

7. An audio processor as defined in claim 3, wherein said low-pass filter comprises an active low-pass filter.

8. An audio processor as defined in claim 4, wherein said detector comprises an active detector.

9. An audio processor as defined in claim 4, wherein said detector comprises a peak detector.

10. An audio processor as defined in claim 1, wherein said control circuit is configured to control bass audio frequencies to limit the Fletcher-Munson effect.

11. An audio processor as defined in claim 4, wherein said control circuit further comprises a non-linear amplifier.

12. An audio processor as defined in claim 1, wherein said variable filter comprises a digital filter receiving an input data stream and providing a filtered output data stream, and wherein the control signal comprises a control variable.

13. An audio processor as defined in claim 12, wherein said control circuit comprises a digital low-pass filter for passing the selected band and a detector algorithm configured for detecting the signal level in the selected band and for generating the control variable in response to the detected signal level.

14. An audio processor as defined in claim 12, wherein the quality factor of the digital filter is controlled by changing the coefficients of the digital filter.

15. An audio processor as defined in claim 13, wherein the detector algorithm establishes time constants of the control variable.

16. An audio processor as defined in claim 15, wherein the control variable has an attack time constant of about 5 milliseconds or less and a decay time constant in a range of about 0.5 to 2.0 seconds.

17. An audio processor as defined in claim 13, wherein the detector algorithm comprises an RMS detector algorithm.

18. An audio processor as defined in claim 13, wherein the digital low-pass filter comprises a digital biquad low-pass filter.

19. An audio processor as defined in claim 1, wherein the variable filter includes a voltage-controlled resistor circuit for controlling the quality factor in response to the control signal.

20. An audio processor as defined in claim 1, wherein the variable filter includes a series gain/attenuation element for controlling the quality factor in response to the control signal.

21. An audio processor comprising:
a variable filter receiving an input signal and providing a filtered output signal, said variable filter having a quality factor that is controlled in response to a control signal, while a cutoff frequency of the variable filter remains fixed;
a low-pass filter for selecting a band of the output signal; and
a detector for detecting a signal level in the band selected by the low-pass filter and for generating the control signal in response to the detected signal level,
wherein said variable filter further comprises a variable gain element responsive to the control signal and configured to amplify a bass frequency band of the input signal, and wherein a magnitude of the control signal is a function of an amplitude of the output signal within the selected band.

22. An audio processor as defined in claim 21, wherein the detector is configured for establishing time constants of the control signal.

23. An audio processor as defined in claim 22, wherein the control signal has an attack time constant of about 5 milliseconds or less and a decay time constant in a range of about 0.5 to 2.0 seconds.

24. An audio processor as defined in claim 21, wherein said low-pass filter and said detector are components of a control circuit which establishes an inverse relationship between the quality factor of the state variable filter and the detected signal level.

25. An audio processor as defined in claim 21, wherein said state variable filter has a cutoff frequency of about 70 Hz.

26. An audio processor as defined in claim 21, wherein said low-pass filter comprises an active low-pass filter.

27. An audio processor as defined in claim 26, wherein said detector comprises an active detector.

28. An audio processor as defined in claim 21, wherein said detector comprises a peak detector.

29. An audio processor as defined in claim 21, wherein said low-pass filter and said detector are configured to control bass audio frequencies to the limit the Fletcher-Munson effect.

30. An audio processor as defined in claim 21, further comprising a non-linear amplifier coupled to said detector.

31. An audio processor as defined in claim 21, wherein said variable filter further comprises:
a fixed band-pass filter in series with the variable gain element responsive to the control signal to provide a controlled band-pass signal; and
a summer for combining the controlled band-pass signal and the input signal to provide the filtered output signal.

32. An audio processor as defined in claim 21, wherein said variable filter comprises a digital filter receiving an input data stream and providing a filtered output data stream.

33. An audio processor as defined in claim 32, wherein said low-pass filter comprises a digital biquad low-pass filter.

34. An audio processor as defined in claim 32, wherein said detector comprises an RMS detector algorithm.

35. An audio processor as defined in claim 32, wherein the digital filter includes a lookup table for establishing a desired relationship between the quality factor of the digital filter and the detected signal level.

36. An audio processor as defined in claim 21, wherein the variable filter includes a voltage-controlled resistor circuit for controlling the quality factor in response to the control signal.

37. An audio processor as defined in claim 21, wherein the variable filter includes a series gain/attenuation element for controlling the quality factor in response to the control signal.

38. An audio processing method comprising the steps of:
filtering an input signal in a variable filter and providing a filtered output signal, where the variable filter has a quality factor that is controlled in response to a control signal, while a cutoff frequency of the variable filter remains fixed;
detecting a signal level representative of input signal level in a selected band to provide a detected signal level; and
amplifying a bass frequency band of the input signal in response to the detected signal level.

39. An audio processing method as defined in claim 38, wherein filtering the input signal comprises filtering the input signal in a high-pass state variable filter.

40. An audio processing method as defined in claim 38, further comprising low-pass filtering of the output signal in the selected band prior to detecting the signal level.

41. An audio processing method as defined in claim 38, wherein controlling the quality factor of the variable filter comprises controlling the quality factor with a control signal having predetermined time constants.

42. An audio processing method as defined in claim 41, wherein the control signal has an attack time constant of about 5 milliseconds or less and a decay time constant in a range of about 0.5 to 2.0 seconds.

43. An audio processing method as defined in claim 38, wherein controlling the quality factor of the variable filter comprises establishing an inverse relationship between the quality factor of the variable filter and the detected signal level.

44. An audio processing method as defined in claim 38, wherein detecting the signal level comprises detecting the output signal in the selected band.

45. An audio processing method as defined in claim 38, wherein controlling the quality factor of the variable filter comprises controlling bass audio frequencies to limit the Fletcher-Munson effect.

46. An audio processing method as defined in claim 38, wherein controlling the quality factor of the variable filter comprises controlling the quality factor according to a non-linear function of detected signal level.

47. An audio processing method as defined in claim 38, wherein filtering the input signal comprises filtering an input data stream with a digital high-pass state variable filter and providing a filtered output data stream.

48. An audio processing method as defined in claim 47, further comprising low-pass filtering of the output data stream with a digital biquad low-pass filter.

49. An audio processing method as defined in claim 47, wherein detecting the signal level comprises detecting the signal level with an RMS detector algorithm.

50. An audio processing method as defined in claim 47, wherein controlling the quality factor of the variable filter comprises changing the coefficients of the digital filter.

51. An audio processor comprising:
a state variable digital high-pass filter receiving an input data stream and providing a filtered output data stream, said digital filter having a quality factor that is controlled in response to a control variable, while a cutoff frequency of the variable filter remains fixed;
a digital band select filter for selecting a band of the output data stream; and
a detector algorithm for detecting a signal level in the band selected by the digital band select filter and for generating the control variable in response to the detected signal level,
wherein the state variable digital high-pass filter includes a lookup table for establishin a desired relationship between the quality factor of the state variable digital high-pass filter and the detected signal level.

52. An audio processor comprising:
a variable filter receiving an input signal and providing an output signal, said variable filter having a fixed cutoff frequency and a quality factor that is controllable in response to a control signal, wherein the variable filter comprises a fixed band-pass filter in series with a variable gain element responsive to the control signal to provide a controlled band-pass signal, and a summer for combining the controlled band-pass signal and the input signal to provide the output signal; and a control circuit configured to detect a signal level representative of input signal level in a selected band and to generate the control signal in response to the detected signal level.

53. An audio processor comprising:

a variable filter receiving an input signal and providing an output signal, said variable filter having a fixed cutoff frequency and a quality factor that is controllable in response to a control signal, wherein the variable filter comprises a digital filter receiving an input data stream and providing a filtered output data stream, wherein the control signal comprises a control variable, and wherein the digital filter includes a lookup table for establishing a desired relationship between the quality factor of the digital filter and the detected signal level; and a control circuit configured to detect a signal level representative of input signal level in a selected band and to generate the control signal in response to the detected signal level.

54. An audio processing method, comprising the steps of:

filtering an input signal in a variable filter and providing a filtered output signal, wherein filtering the input signal comprises filtering an input data stream with a digital high-pass state variable filter and providing a filtered output data stream;

detecting a signal level representative of input signal level in a selected band to provide a detected signal level; and controlling a quality factor of the variable filter in response to the detected signal level, wherein controlling the quality factor of the variable filter comprises accessing control values in a lookup table in response to the detected signal level.

* * * * *